(12) United States Patent
Hitomi et al.

(10) Patent No.: US 11,509,336 B2
(45) Date of Patent: Nov. 22, 2022

(54) RADIO-FREQUENCY CIRCUIT, COMMUNICATION DEVICE, AND ANTENNA MODULE

(71) Applicant: MURATA MANUFACTURING CO., LTD., Kyoto (JP)

(72) Inventors: Shinya Hitomi, Nagaokakyo (JP); Hirotsugu Mori, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/897,465

(22) Filed: Jun. 10, 2020

(65) Prior Publication Data

US 2020/0395962 A1  Dec. 17, 2020

(30) Foreign Application Priority Data

Jun. 14, 2019  (JP) .............................. JP2019-110982

(51) Int. Cl.
*H04B 1/04* (2006.01)
*H03F 3/24* (2006.01)
*H04B 1/00* (2006.01)

(52) U.S. Cl.
CPC .......... *H04B 1/0475* (2013.01); *H03F 3/245* (2013.01); *H04B 1/0064* (2013.01); *H03F 2200/171* (2013.01); *H03F 2200/372* (2013.01); *H03F 2200/451* (2013.01)

(58) Field of Classification Search
CPC ..... H04B 1/0475; H04B 1/0064; H03F 3/245; H03F 2200/171; H03F 2200/372; H03F 2200/451
USPC ...................................................... 455/114.2
See application file for complete search history.

(56) References Cited

U.S. PATENT DOCUMENTS

| | | | | | |
|---|---|---|---|---|---|
| 5,444,418 | A | * | 8/1995 | Mitzlaff | ................ H03F 1/0288 330/52 |
| 10,141,894 | B1 | * | 11/2018 | Aruppukottai Boominathan | ........ H03F 1/3205 |
| 10,440,665 | B1 | * | 10/2019 | Witherell | ............ H04W 52/367 |
| 10,505,700 | B1 | * | 12/2019 | Lan | ........................ H04B 1/525 |

(Continued)

FOREIGN PATENT DOCUMENTS

| | | |
|---|---|---|
| JP | 2016-501467 A | 1/2016 |
| JP | 2018-191330 A | 11/2018 |

OTHER PUBLICATIONS

3GPP TSG-RAN WG4 Meeting #88bis, R4-1812406, Qualcomm Inc., Chengdu, CN, Oct. 8-12, 2018.

(Continued)

*Primary Examiner* — Ernest G Tacsik
(74) *Attorney, Agent, or Firm* — Pearne & Gordon LLP (57) ABSTRACT

A radio-frequency circuit includes a first power amplifier that outputs a first transmission signal and a second power amplifier that outputs a second transmission signal having a frequency different from a frequency of the first transmission signal. In a period in which the first transmission signal the second transmission signal are simultaneously outputted, at least one of the first power amplifier or the second power amplifier reduces transmission power of the at least one of the first power amplifier or the second power amplifier to cause a power component of intermodulation distortion superimposed on a transmission signal output from the first power amplifier and the second power amplifier to be less than or equal to a threshold value.

20 Claims, 6 Drawing Sheets

(56) References Cited

U.S. PATENT DOCUMENTS

| | | | |
|---|---|---|---|
| 2004/0214537 A1* | 10/2004 | Bargroff | H03D 7/1425 |
| | | | 455/136 |
| 2006/0160502 A1* | 7/2006 | Kintis | H03F 1/3223 |
| | | | 455/127.1 |
| 2008/0204142 A1* | 8/2008 | Kang | H03F 1/301 |
| | | | 330/281 |
| 2009/0079500 A1* | 3/2009 | Cowley | H03G 1/0088 |
| | | | 330/254 |
| 2014/0051373 A1* | 2/2014 | Klomsdorf | H04B 1/525 |
| | | | 455/114.3 |
| 2014/0133364 A1 | 5/2014 | Weissman et al. | |
| 2016/0242128 A1 | 8/2016 | Loehr et al. | |
| 2017/0077981 A1* | 3/2017 | Tobisu | H04B 1/0475 |
| 2017/0093347 A1* | 3/2017 | Zhu | H03F 3/245 |
| 2017/0104509 A1* | 4/2017 | Khlat | H04L 5/001 |
| 2018/0294858 A1* | 10/2018 | Pehlke | H04B 7/0413 |
| 2018/0343022 A1* | 11/2018 | Tsutsui | H03F 3/245 |
| 2019/0052234 A1* | 2/2019 | Braun | H03F 3/72 |
| 2019/0081649 A1* | 3/2019 | Khlat | H04B 1/40 |
| 2019/0158137 A1* | 5/2019 | Brunel | H04B 1/005 |
| 2019/0267956 A1* | 8/2019 | Granger-Jones | H04B 1/1027 |
| 2019/0380135 A1* | 12/2019 | Kwok | H04W 52/146 |
| 2020/0178334 A1* | 6/2020 | Karimli | H04W 16/14 |
| 2021/0376989 A1* | 12/2021 | Lim | H04W 24/10 |

OTHER PUBLICATIONS

3GPP TSG-RAN WG4 Meeting #88bis, R4-1812489, Dish Network, Chengdu, CN, Oct. 8-12, 2018.

* cited by examiner

RADIO-FREQUENCY CIRCUIT, COMMUNICATION DEVICE, AND ANTENNA MODULE

CROSS REFERENCE TO RELATED APPLICATION

The present application is based on and claims priority of Japanese Patent Application No. 2019-110982 filed on Jun. 14, 2019. The entire disclosure of the above-identified application, including the specification, drawings and claims is incorporated herein by reference in its entirety.

TECHNICAL FIELD

The present disclosure relates to a radio-frequency circuit, a communication device including the radio-frequency circuit, and an antenna module.

BACKGROUND

Radio-frequency circuits that support multiband and multimode communication should simultaneously transmit a plurality of radio-frequency signals having different frequencies with high quality.

Patent Literature (PTL) 1 discloses an antenna interface circuit (radio-frequency circuit) capable of simultaneously transmitting and simultaneously receiving radio-frequency signals of a plurality of communication bands. Transmitters (power amplifiers) and receivers (low-noise amplifiers) for respective communication bands are disposed in a first transceiver connected to a primary antenna, and transmitters (power amplifiers) and receivers (low-noise amplifiers) for respective communication bands are disposed in a second transceiver connected to a secondary antenna.

PTL 1: Japanese Unexamined Patent Application Publication (Translation of PCT Application) No. 2016-501467

BRIEF SUMMARY

However, in the radio-frequency circuit disclosed in PTL 1, when radio-frequency signals having different frequencies are simultaneously output from the power amplifiers, there are cases where the transmission signal output from one power amplifier leaks into another power amplifier. In such a case, for example, there is the issue that, in the other amplifier, intermodulation distortion generated by the mixing of two radio-frequency signals having mutually different frequencies causes radio-frequency signal quality to deteriorate.

In view of this, the present disclosure relates to a radio-frequency circuit, a communication device, and an antenna module that reduce generation of unwanted waves such as intermodulation distortion when a plurality of radio-frequency signals amplified by a plurality of power amplifiers are being simultaneously transmitted.

A radio-frequency circuit according to an aspect of the present disclosure includes: a first power amplifier configured to output a first transmission signal; and a second power amplifier configured to output a second transmission signal having a frequency different from a frequency of the first transmission signal, wherein: in a period in which outputting of the first transmission signal from the first power amplifier and outputting of the second transmission signal from the second power amplifier are simultaneously executed, at least one of the first power amplifier or the second power amplifier is configured to reduce transmission power of the at least one of the first power amplifier or the second power amplifier to cause a power component of intermodulation distortion to be less than or equal to a threshold value, the intermodulation distortion being superimposed on one of the first transmission signal output from the first power amplifier and the second transmission signal output from the second power amplifier.

The present disclosure can provide a radio-frequency circuit, a communication device, and an antenna module that reduce generation of unwanted waves such as intermodulation distortion when a plurality of radio-frequency signals amplified by a plurality of power amplifiers are being simultaneously transmitted.

BRIEF DESCRIPTION OF DRAWINGS

These and other advantages and features will become apparent from the following description thereof taken in conjunction with the accompanying Drawings, by way of non-limiting examples of embodiments disclosed herein.

DETAILED DESCRIPTION

Hereinafter, exemplary embodiments of the present disclosure will be described in detail with reference to the implemental examples and the drawings. It should be noted that each of the subsequently described exemplary embodiments shows a generic or a specific example. The numerical values, shapes, materials, elements, the arrangement and connection of the elements, and others indicated in the following exemplary embodiments are mere examples, and therefore are not intended to limit the present disclosure. Among the structural components described in the following exemplary embodiments, structural components not recited in any one of the independent claims are described as optional structural components. In addition, the sizes of the elements and the ratio of the sizes illustrated in the drawings are not necessarily accurate.

Embodiments

1. Configuration of Radio-Frequency Circuit and Communication Device

Figure 1:
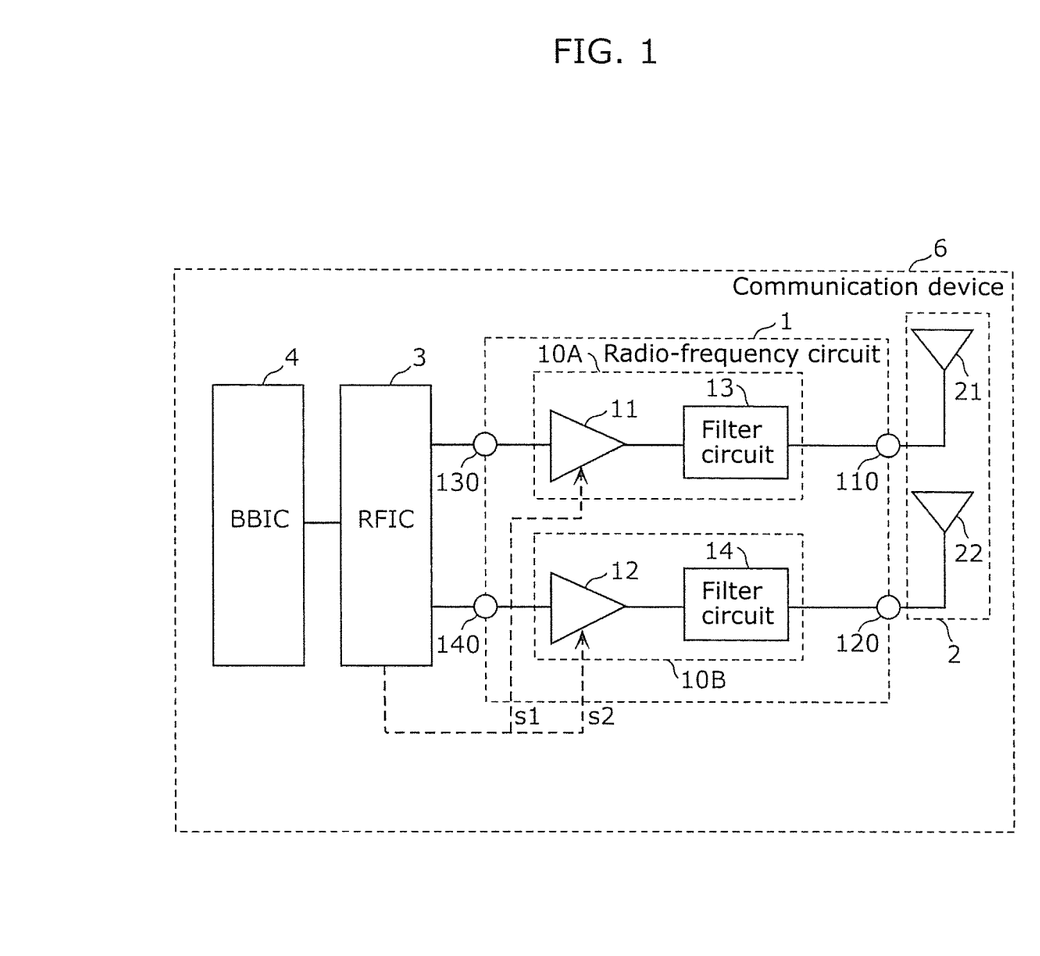
FIG. 1 is an example of a circuit configuration diagram of a radio-frequency circuit and a communication device according to an embodiment.

FIG. 1 is an example of a circuit configuration diagram of radio-frequency circuit 1 and communication device 6 according to the embodiment. As illustrated in the figure, communication device 6 includes radio-frequency circuit 1, antenna element 2, RF signal processing circuit (RFIC) 3, and baseband signal processing circuit (BBIC) 4.

Radio-frequency circuit 1 includes input terminals 130 and 140, output terminals 110 (a first output terminal) and 120 (a second output terminal), and transmission amplifying circuits 10A and 10B.

Transmission amplifying circuit 10A is an example of a first transmission amplifying circuit disposed on a path that connects input terminal 130 and output terminal 110, and includes power amplifier 11 and filter circuit 13. Transmission amplifying circuit 10B is an example of a second transmission amplifying circuit disposed on a path that connects input terminal 140 and output terminal 120, and includes power amplifier 12 and filter circuit 14.

Power amplifier 11, which is an example of a first power amplifier, amplifies a radio-frequency signal input to input terminal 130 and outputs a first transmission signal generated in the amplification to output terminal 110 via filter circuit 13. Filter circuit 13 is connected between the output terminal of power amplifier 11 and output terminal 110, has a passband including a first frequency, and transmits the first transmission signal having the first frequency with low loss.

Power amplifier 12, which is an example of a second power amplifier, amplifies a radio-frequency signal input to input terminal 140 and outputs a second transmission signal generated in the amplification to output terminal 120 via filter circuit 14. Filter circuit 14 is connected between the output terminal of power amplifier 12 and output terminal 120, has a passband including a second frequency, and transmits the second transmission signal having the second frequency with low loss.

Each of power amplifiers 11 and 12 includes, for example, at least one bipolar amplifier transistor having a base terminal, an emitter terminal, and a collector terminal. Each of power amplifiers 11 and 12, for example, includes two or more stages of cascade-connected amplifier transistors; the collector terminal of the kth-stage amplifier transistor is connected to the base terminal of the (k+1)th-stage amplifier transistor. Due to the cascade connection, the base terminal of the front-most stage (the first stage) amplifier transistor becomes the input terminal of power amplifier 11 or 12, and the collector terminal of the rear-most stage amplifier transistor becomes the output terminal of power amplifier 11 or 12.

It should be noted that the amplifier transistors included in power amplifiers 11 and 12 are not limited to bipolar transistors, and may be metal-oxide-semiconductor field-effect-transistors (MOSFETs) for example. Furthermore, power amplifiers 11 and 12 may be integrated in a single chip or may use different chips.

At least one bias signal (a direct current bias voltage or a direct current bias current) is supplied to the base terminal and a direct current power supply voltage is supplied to the collector terminal of each of the amplifier transistors included in each of power amplifiers 11 and 12. Changing (the voltage or current of) the bias signal supplied to the base terminals of each of the amplifier transistors optimizes the operating points of the respective amplifier transistors.

It should be noted that filter circuits 13 and 14, input terminals 130 and 140, and output terminals 110 and 120 are not necessarily essential elements of radio-frequency circuit 1 according to this embodiment in FIG. 1.

In the above-described configuration, with radio-frequency circuit 1, the first transmission signal amplified by power amplifier 11 from output terminal 110 and the second transmission signal amplified by power amplifier 12 from output terminal 120 can be in a state of transmission at a same point in time.

Here, in radio-frequency circuit 1 according to this embodiment in FIG. 1, at least one of power amplifier 11 or 12 reduces a transmission power in a period in which output of the first transmission signal from power amplifier 11 and output of the second transmission signal from power amplifier 12 are being executed simultaneously.

In a radio-frequency circuit including two power amplifiers, when two radio-frequency signals are being simultaneously transmitted, it is assumed that the output signal of one power amplifier will leak into the other power amplifier, and the output signal of the one power amplifier that has leaked-in will mix with the output signal of the other power amplifier, thereby generating intermodulation distortion (hereinafter sometimes referred to as IMD). In addition, it is assumed that an unwanted wave such as a spurious wave is superimposed on at least one of the two transmission signals. When this unwanted wave such as intermodulation distortion flows into a radio-frequency circuit that transmits a radio-frequency signal having the same frequency component as the unwanted wave, there arises the issue that the predetermined signal quality level of the radio-frequency circuit cannot be satisfied.

In response to this issue, according to radio-frequency circuit 1 according to this embodiment in FIG. 1, at least one of power amplifier 11 or 12 is capable of reducing a transmission power in a period in which the first transmission signal and the second transmission signal are being simultaneously output. According to this configuration, in the period in which the first transmission signal and the second transmission signal are being simultaneously output, when the power level of an unwanted wave that is superimposed on at least one of the first transmission signal or the second transmission signal that are output from radio-frequency circuit 1 exceeds a permitted value (a threshold value), the transmission power of at least one of power amplifier 11 or 12 can be reduced. According to this, in the period in which the first transmission signal and the second transmission signal are being simultaneously output, the power level of the unwanted wave that is superimposed on at least one of the first transmission signal or the second transmission signal that are output from radio-frequency circuit 1 can be reduced to the permitted value (threshold value) or less. Therefore, it is possible to provide radio-frequency circuit 1 and communication device 6 in which generation of an unwanted wave such as intermodulation distortion is reduced when the first transmission signal and the second transmission signal are being simultaneously output.

Furthermore, in radio-frequency circuit 1 according to this embodiment in FIG. 1, in the period in which the first transmission signal and the second transmission signal are being simultaneously output, the transmission power of at least one of power amplifiers 11 or 12 may be reduced so that the power component of the intermodulation distortion that is superimposed on the first transmission signal or the second transmission signal becomes less than or equal to the threshold value.

According to this configuration, in the period in which the first transmission signal and the second transmission signal are being simultaneously output, the power level of the intermodulation distortion that is superimposed on at least one of the first transmission signal or the second transmission signal that are output from radio-frequency circuit 1 can be reduced to the threshold value or less. Therefore, it is possible to provide radio-frequency circuit 1 and communication device 6 that reduce the generation of intermodulation distortion when the first transmission signal and the second transmission signal are being simultaneously output.

Furthermore, in radio-frequency circuit 1 according to this embodiment in FIG. 1, each of output terminals 110 and 120 are connected to different antenna elements 21 and 22.

In the configuration in which the respective transmission signals output from transmission amplifying circuits 10A and 10B are transmitted from different antenna elements 21 and 22, the transmission signal emitted from one antenna element leaks into the other antenna element, and the transmission signal transmitted from the transmission amplifying circuit connected to the other antenna element mixes with the transmission signal that has leaked into the other antenna element, and thus intermodulation distortion is generated.

Even in the above-described configuration, when two transmission signals are being simultaneously output, the transmission power of at least one of power amplifier 11 or 12 can be reduced, and thus generation of unwanted waves such as intermodulation distortion can be reduced. Therefore, deterioration of signal quality level in radio-frequency circuit 1 and surrounding circuits can be reduced.

It should be noted that as a means to reduce the transmission power of power amplifier 11 or 12, it is possible to change the direct current power supply voltage, or the bias voltage, supplied to the respective amplifier transistors included in power amplifiers 11 and 12.

Hereinafter, the elements included in communication device 6 other than radio-frequency circuit 1 will be described.

Antenna circuit 2 includes antenna elements 21 and 22. Antenna element 21 is connected to output terminal 110 of radio-frequency circuit 1, and preferentially transmits and receives a first transmission signal. Antenna element 22 is connected to output terminal 120 of radio-frequency circuit 1, and preferentially transmits and receives a second transmission signal.

RFIC 3 is an RF signal processing circuit that processes a radio-frequency signal. Specifically, RFIC 3 performs, by upconversion, and the like, signal processing on a transmission signal input from BBIC 4, and outputs the radio-frequency transmission signal generated by the signal processing to radio-frequency circuit 1. Furthermore, RFIC 3 includes a controller that outputs control signals (s1 and s2 in FIG. 1) for controlling the gain of power amplifiers 11 and 12, to power amplifier 11 and 12.

BBIC 4 is a circuit that performs signal processing using an intermediate frequency band having a lower frequency than radio-frequency signals propagating in radio-frequency circuit 1. The signal processed by BBIC 4 is, for example, used as an image signal for image display or as a sound signal for conversation via a speaker.

RFIC 3 and BBIC 4 are signal processing circuits that process radio-frequency signals.

According to the above-described configuration of communication device 6, for example, RFIC 3 receives the power information of the unwanted waves in the first transmission signal output from power amplifier 11 and the second transmission signal output from power amplifier 12, and the controller of RFIC 3 determines the gains of power amplifiers 11 and 12 based on the power information. The controller outputs control signal s1 and control signal s2 which conform to the determined gains to power amplifier 11 and power amplifier 12, respectively. Therefore, it is possible to reduce the output power of power amplifiers 11 and 12 and thereby reduce unwanted waves such as intermodulation distortion, using a simplified circuit configuration.

It should be noted that in communication device 6 according to this embodiment in FIG. 1, antenna circuit 2 and BBIC 4 are not necessarily essential elements.

Furthermore, the controller that outputs the control signals for controlling the gains of power amplifiers 11 and 12 need not be included in RFIC 3, and may be included in BBIC 4, or may be included in another element of communication device 6 other than RFIC 3 and BBIC 4.

Furthermore, although, in this embodiment, transmission amplifying circuit 10A and transmission amplifying circuit 10B are connected to different antenna elements 21 and 22, respectively, transmission amplifying circuits 10A and 10B may be connected to the same single antenna element. In this case, output terminals 110 and 120 may be consolidated into a single output terminal.

It should be noted that in radio-frequency circuit 1 according to this embodiment in FIG. 1, in the period in which the outputting of the first transmission signal and the outputting of the second transmission signal are simultaneously executed, power amplifier 11 may reduce the power of the first transmission signal to cause the power component of the intermodulation distortion superimposed on the first transmission signal to be less than or equal to the threshold value.

According to this configuration, in the period in which the first transmission signal and the second transmission signal are simultaneously output, reducing the transmission power of power amplifier 11, which is the target of intermodulation distortion reduction, makes it possible for the power level of the intermodulation distortion superimposed on the first transmission signal to be reduced to the threshold value or less.

It should be noted that in radio-frequency circuit 1 according to this embodiment in FIG. 1, in the period in which the outputting of the first transmission signal and the outputting of the second transmission signal are simultaneously executed, power amplifier 12 may reduce the power of the second transmission signal to cause the power component of the intermodulation distortion superimposed on the first transmission signal to be less than or equal to the threshold value.

According to this configuration, in the period in which the first transmission signal and the second transmission signal are simultaneously output, reducing the transmission power of power amplifier 12, which is not the target of intermodulation distortion reduction, makes it possible for the power level of the intermodulation distortion that is superimposed on the first transmission signal to be reduced to the threshold value or less.

Furthermore, in radio-frequency circuit 1 according to this embodiment in FIG. 1, in the period in which the outputting of the first transmission signal and the outputting of the second transmission signal are simultaneously executed, power amplifier 11 and power amplifier 12 may the reduce the power of the first transmission signal and the power of the second transmission signal, respectively, to cause the power component of the intermodulation distortion superimposed on one of the first transmission signal and the second transmission signal to be less than or equal to the threshold value.

According to this configuration, in the period in which the first transmission signal and the second transmission signal are simultaneously output, reducing the transmission power of both power amplifiers 11 and 12 makes it possible for the power level of the intermodulation distortion that is superimposed on the first transmission signal or the second transmission signal to be reduced to the threshold value or less. Furthermore, in this case, the transmission power of only power amplifier 11 or 12 need not be considerably reduced, and thus the difference between the transmission power of power amplifier 11 and the transmission power of power amplifier 12 can be reduced. Therefore, the risk of the transmission power of either the first transmission signal or the second transmission signal dropping excessively and causing the transmission signal to become incommunicable can be reduced.

Figure 2:
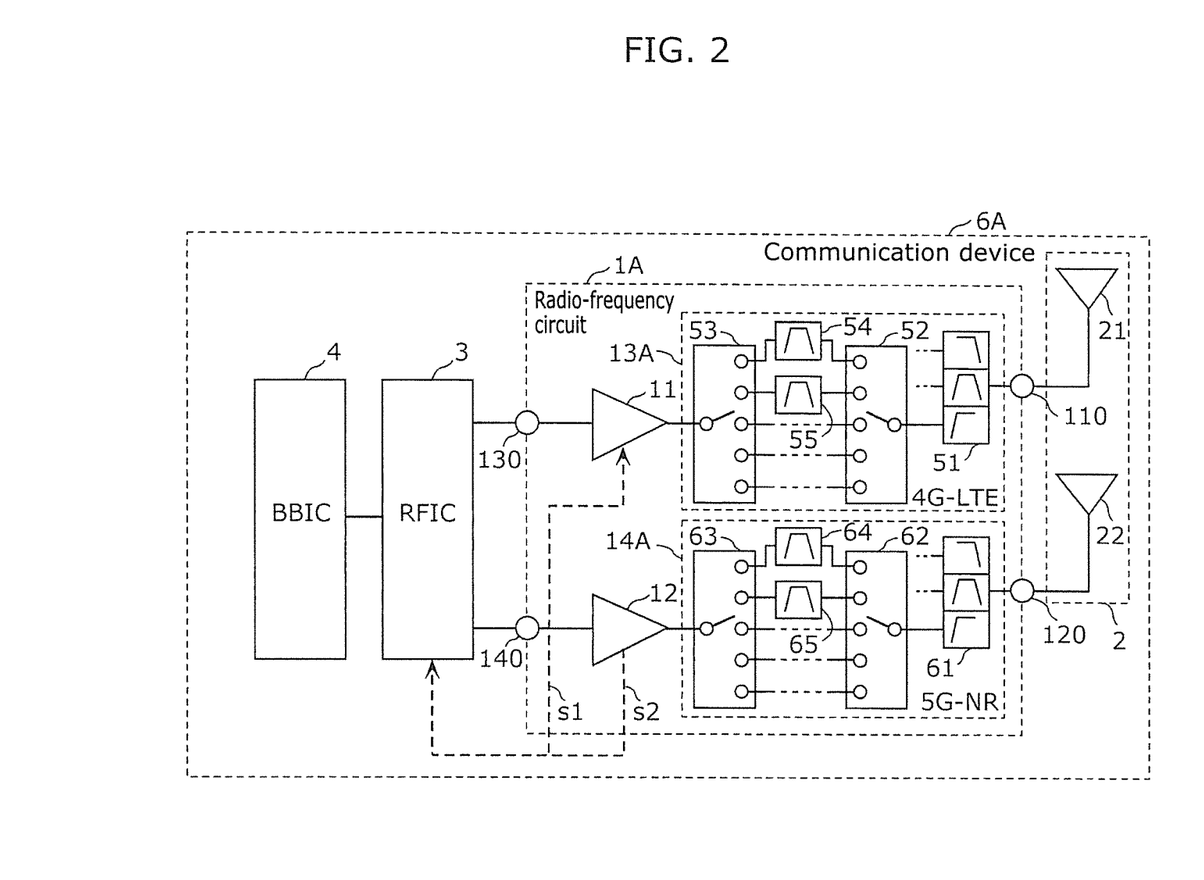
FIG. 2 is an example of a circuit configuration diagram of a radio-frequency circuit and a communication device according to an implemental example.

2. Configuration of Radio-Frequency Circuit and Communication Device According to an Implemental Example FIG. 2 is a circuit configuration diagram of radio-frequency circuit 1A and communication device 6A according to an implemental example. Radio-frequency circuit 1A and communication device 6A illustrated in FIG. 2 are specific circuit configuration examples of radio-frequency circuit 1 and communication device 6 according to the embodiment in FIG. 1. Hereinafter, description of radio-frequency circuit 1A and communication device 6A according to the implemental example in FIG. 2 will be carried out omitting elements that are the same as those in radio-frequency circuit 1 and communication device 6 according to the embodiment in FIG. 1 and centering on those elements that are different.

As illustrated in FIG. 2, communication device 6A includes radio-frequency circuit 1A, antenna circuit 2, RFIC 3, and BBIC 4.

Radio-frequency circuit 1A includes input terminals 130 and 140, output terminals 110 (a first output terminal) and 120 (a second output terminal), power amplifiers 11 and 12, and filter circuits 13A and 14A. In radio-frequency circuit 1A, power amplifiers 11 and 12 and filter circuits 13A and 14A are mounted on a single mounting board.

Power amplifier 11 and filter circuit 13A are included in a first transmission amplifying circuit disposed in a path that connects input terminal 130 and output terminal 110. Power amplifier 12 and filter circuit 14A are included in a second transmission amplifying circuit disposed in a path that connects input terminal 140 and output terminal 120.

The first transmission amplifying circuit transfers, for example, the first transmission signal used in the fourth generation mobile communication system (4G). Furthermore, the second transmission amplifying circuit transfers, for example, the second transmission signal used in the fifth generation mobile communication system (5G). In other words, the first transmission signal is a transmission signal used in 4G, and the second transmission signal is a transmission signal used in 5G.

Filter circuit 13A is connected to the output terminal of power amplifier 11 and to output terminal 110, has a passband including a first frequency, and transmits the first transmission signal having the first frequency with low loss. Filter circuit 13A includes multiplexer 51, switches 52 and 53, and filters 54 and 55. It should be noted that, aside from filters 54 and 55, other filters may be disposed between switches 52 and 53.

Multiplexer 51 includes, for example, a low-pass filter, a bandpass filter, and a high-pass filter. The low-pass filter has as a passband, for example, a frequency band of a communication band belonging to a low band group among 4G-long term evolution (LTE) communication bands. The bandpass filter has as a passband, for example, a frequency band of a communication band belonging to a middle band group among 4G-LTE communication bands. The high-pass filter has as a passband, for example, a frequency band of a communication band belonging to a high band group among 4G-LTE communication bands.

Filter 54 is a bandpass filter having as a passband, for example, the 4G-LTE Band 41 (a frequency band from 2496 MHz to 2690 MHz). Furthermore, filter 55 is, for example, a bandpass filter having as a passband, for example, 4G-LTE Band 40 (a frequency band from 2300 MHz to 2400 MHz) or Band 30 (a transmission band from 2305 MHz to 2315 MHz).

Switch 52 is disposed between multiplexer 51 and filters 54 and 55, and switch 53 is disposed between power amplifier 11 and filters 54 and 55. Switch 52 switches the connection between any of filters 54, 55, etc., and multiplexer 51, based on a control signal from RFIC 3. Switch 53 switches the connection between any of filters 54, 55, etc., and power amplifier 11, based on a control signal from RFIC Filter circuit 14A is connected between the output terminal of power amplifier 12 and output terminal 120, has a passband including a second frequency, and transmits a second transmission signal having the second frequency with low loss. Filter circuit 14A includes multiplexer 61, switches 62 and 63, and filters 64 and 65. It should be noted that, aside from filters 64 and 65, other filters may be disposed between switches 62 and 63.

Multiplexer 61 includes, for example, a low-pass filter, a bandpass filter, and a high-pass filter. The low-pass filter has as a passband, for example, a frequency band of a communication band belonging to a low band group among 5G-new radio (NR) communication bands. The bandpass filter has as a passband, for example, a frequency band of a communication band belonging to a middle band group among 5G-NR communication bands. The high-pass filter has as a passband, for example, a frequency band of a communication band belonging to a high band group among 5G-NR communication bands.

Filter 64 is a bandpass filter having as a passband, for example, the 5G-NR n41 (a frequency band from 2496 MHz to 2690 MHz). Furthermore, filter 65 is a bandpass filter having as a passband, for example, the 5G-NR n40 (a frequency band from 2300 MHz to 2400 MHz).

Switch 62 is disposed between multiplexer 61 and filters 64 and 65, and switch 63 is disposed between power amplifier 12 and filters 64 and 65. Switch 62 switches the connection between any of filters 64, 65, etc., and multiplexer 61, based on a control signal from RFIC 3. Switch 63 switches the connection between any of filters 64, 65, etc., and power amplifier 12, based on a control signal from RFIC 3.

In the above-described configuration, with radio-frequency circuit 1A the first transmission signal belonging to 4G-LTE amplified by power amplifier 11 from output terminal 110 and the second transmission signal belonging to 5G-NR amplified by power amplifier 12 from output terminal 120 can be in a state of transmission at a same point in time.

Like radio-frequency circuit 1A according to this implemental example, in the stage of transitioning from 4G to 5G, a system that causes coexistence of 4G and 5G has been proposed. In this case, for example, a radio-frequency signal in a 4G-LTE communication band and a radio-frequency signal in a 5G-NR communication band are transmitted simultaneously (LTE-NR dual connectivity: Evolved-Universal Terrestrial Radio Access Network New Radio-Dual Connectivity (EN-DC)). In this system, when the intermodulation distortion generated by the first transmission signal used in 4G and the second transmission signal used in 5G exceeds a reference value, the 4G service and 5G service coexistence specification in the third generation partnership project (3GPP) cannot be satisfied. Furthermore, when the frequency of the intermodulation distortion overlaps with the passband of the first transmission amplifying circuit or the second transmission amplifying circuit, the in-band spurious emission specification in 3GPP cannot be satisfied. It should be noted that the 4G service and 5G service coexistence specification in 3GPP and the in-band spurious emission specification in 3GPP are stipulated in TS 38.101-1, for example.

Figure 3:
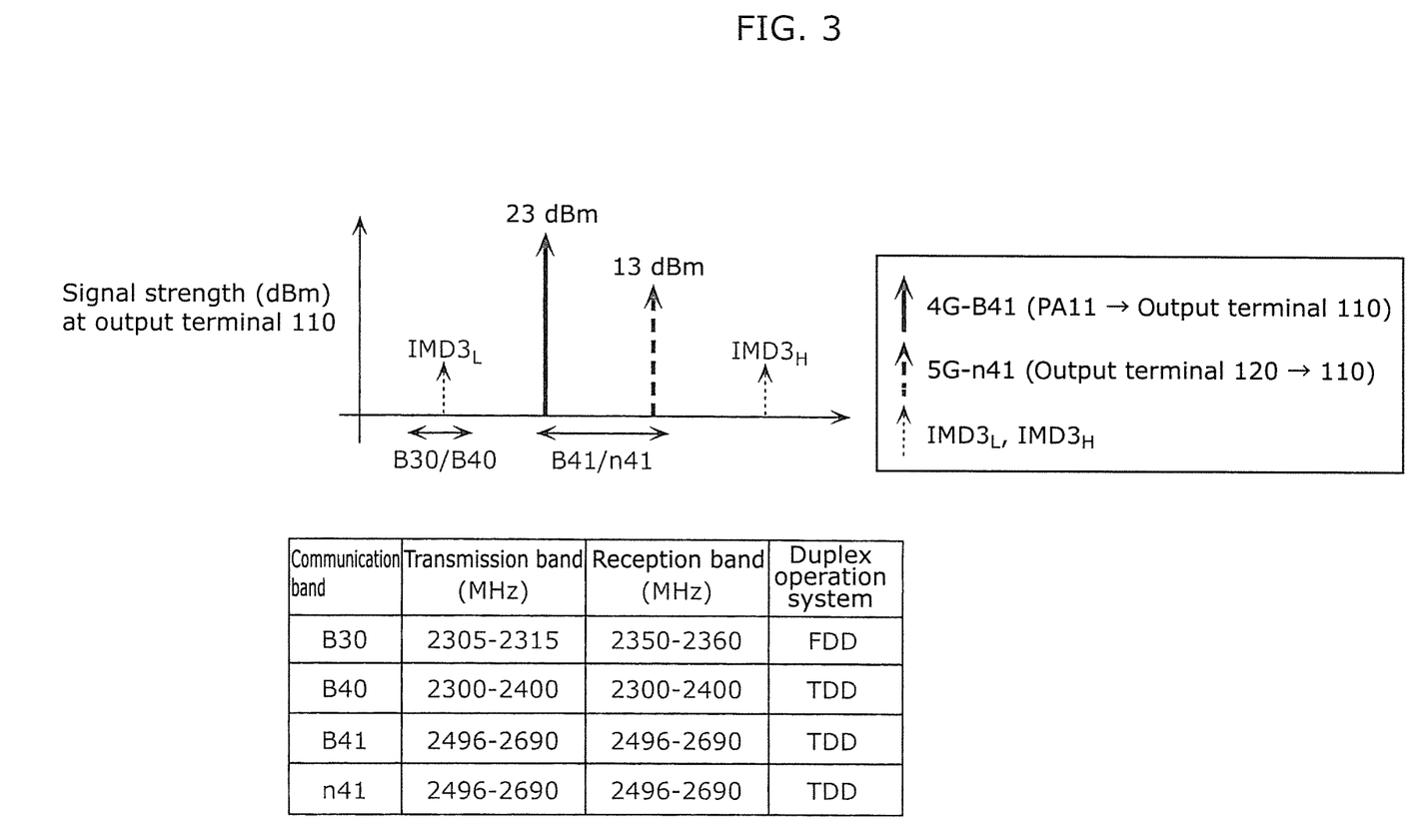
FIG. 3 is an outline diagram representing a first example of a frequency relationship between a 4G-LTE radio-frequency signal, a 5G-NR radio-frequency signal, and intermodulation distortion.

FIG. 3 is an outline diagram representing a first example of a frequency relationship between a 4G-LTE radio-frequency signal, a 5G-NR radio-frequency signal, and intermodulation distortion. The figure indicates the generation of third-order intermodulation distortion in the case where, in radio-frequency circuit 1A, the first transmission amplifying circuit transfers a 4G-LTE Band 41 radio-frequency signal and the second transmission amplifying circuit transfers a 5G-NR n41 radio-frequency signal (EN-DC).

It should be noted that, in this case, the first transmission signal transferred in the first transmission amplifying circuit is a signal of a predetermined channel (hereinafter referred to as the first channel) in the 4G-LTE Band 41 (a first communication band), and the second transmission signal transmitted by the second transmission amplifying circuit is a signal of a predetermined channel (hereinafter referred to as the second channel) in the 5G-NR n41 (a second communication band). The first channel in the 4G-LTE Band 41 and the second channel in the 5G-NR n41 have different central frequencies. Specifically, the first transmission signal is a transmission signal of the first channel in the first communication band stipulated in 4G, and the second transmission signal is a transmission signal of the second channel in the second communication band stipulated in 5G. Here, the first communication band and the second communication band have the same frequency range.

Assuming that the strength of the 4G first transmission signal output from power amplifier 11 is 27 dBm and the propagation loss at filter circuit 13A is 4 dB, the strength of the first transmission signal transmitted from antenna element 21 is 23 dBm. In the same manner, assuming that the strength of the 5G second transmission signal output from power amplifier 12 is 27 dBm and the propagation loss at filter circuit 14A is 4 dB, the strength of the second transmission signal transmitted from antenna element 22 is 23 dBm. Here, if the isolation between antenna elements 21 and 22 is 10 dB, the strength of the 5G radio-frequency signal that leaks into antenna element 21 is 13 dBm (=23 dBm-10 dB). In output terminal 110, intermodulation distortion is generated by the 4G first transmission signal (strength: 23 dBm) and the 5G second transmission signal that has leaked in (strength: 13 dBm).

Here, for example, when the first channel (a first frequency f1) in 4G-LTE Band 41 is a channel on the low-frequency side of Band 41 and the second channel (a second frequency f2) in 5G-NR n41 is a channel on the high-frequency side of n41, third-order intermodulation distortions $IMD_{3L}$ (frequency: 2f1−f2) and $IMD_{3H}$ (frequency: 2f2−f1) are generated. Of these, third-order intermodulation distortion $IMD_{3L}$ overlaps with 4G-LTE Band 30 or 40. At this time, when filter 55 included in the first transmission amplifying circuit is a circuit that transmits or receives a radio-frequency signal of the 4G-LTE Band 30 or Band 40 or when such a circuit is disposed near radio-frequency circuit 1A, and third-order intermodulation distortion $IMD_{3L}$ exceeds the reference value in 3GPP, the 4G service and 5G service coexistence specification cannot be satisfied, and thus the signal quality in the above-mentioned circuit deteriorates. It should be noted that, aside from the circuit included in the first transmission amplifying circuit, the circuit in which signal quality deterioration occurs due to third-order intermodulation distortion such as that described above may be a circuit connected to multiplexer 51 or a circuit included in the second transmission amplifying circuit. Furthermore, the intermodulation distortion generated by the 4G radio-frequency transmission signal and the 5G radio-frequency transmission signal that has leaked in is not limited to third-order intermodulation distortion.

In contrast, in radio-frequency circuit 1A according to this implemental example, in the period in which the first transmission signal and the second transmission signal are simultaneously output, the transmission power of at least one of power amplifier 11 or 12 is reduced so that the power component of the third-order intermodulation distortion that is superimposed on the first transmission signal becomes less than or equal to the threshold value. According to this, the intermodulation distortion generated by the first transmission signal used in 4G and the second transmission signal used in 5G can be reduced. Therefore, the 4G service and 5G service coexistence specification in 3GPP can be satisfied.

Table 1 indicates an example of a power intensity relationship between the 4G-LTE first transmission signal, the 5G-NR second transmission signal, and third-order intermodulation distortion $IMD_{3L}$. The first transmission signal is a signal of a first channel (ch1) in the 4G-LTE Band 41, and the second transmission signal is a signal of a second channel (ch2) in the 5G-NR n41. Table 1 indicates, in order from the left, the power of the first transmission signal at output terminal 110, the power of second transmission signal at output terminal 120, and the power component of third-order intermodulation distortion $IMD_{3L}$ at output terminal 110.

TABLE 1

| | 1st transmission signal LTE (B41) ch1 (dBm) at output terminal 110 | 2nd transmission signal NR (n41) ch2 (dBm) at output terminal 120 | Intermodulation distortion $IMD_{3L}$ B30/40 band (dBm/MHz) at output terminal 110 |
|---|---|---|---|
| Output case 1 | 23 | 23 | −12 |
| Output case 2 | 23 | 13 | −26 |
| Output case 3 | 23 | 3 | −40 |

First, assume that, in an initial stage in which the first transmission signal and the second transmission signal are simultaneously output, radio-frequency circuit 1A outputs the first transmission signal of Band 41 (for example, ch3) at 23 dBm from the first transmission amplifying circuit, and outputs the second transmission signal of n41 (for example, ch4) at 13 dBm from the second transmission amplifying circuit, according to a request from a base station, for example. It should be noted that, at this time, a 27 dBm first transmission signal is output from power amplifier 11 and a 17 dBm second transmission signal is output from power amplifier 12.

Next, assume that radio-frequency circuit 1A is scheduled to output the Band 41 (ch1) first transmission signal at 23 dBm from the first transmission amplifying circuit, and output the n41 (ch2) second transmission signal at 13 dBm from the second transmission amplifying circuit, according to a request from a base station (Output case 2 in Table 1). In this case, as indicated in Table 1, third-order intermodulation distortion $IMD_{3L}$ becomes −26 dBm/MHz. Here, it is assumed that the reference value (threshold value) of third-order intermodulation distortion $IMD_{3L}$ in the 4G-LTE Band 30 or 40 band is −40 dBm/MHz. At this time, referring to Table 1, third-order intermodulation distortion $IMD_{3L}$ satisfies the reference value (threshold value) (i.e., −40 dBm/MHz) when the Band 41 (ch1) first transmission signal from the first transmission amplifying circuit is output at 23 dBm, and the n41 (ch2) second transmission signal from the second transmission amplifying circuit is output at 13 dBm (Output case 3 in Table 1). It should be noted that a first transmission signal of 27 dBm is output from power amplifier 11 and a second transmission signal of 7 dBm is output from power amplifier 12.

In view of this configuration, radio-frequency circuit 1A reduces the second transmission signal from the second amplifying circuit, from 13 dBm to 3 dBm. According to this reduction of the second transmission signal, third-order intermodulation distortion $IMD_{3L}$ is reduced to −40 dBm/MHz. In other words, the intermodulation distortion generated by the first transmission signal used in 4G and the second transmission signal used in 5G can be reduced. Therefore, the 4G service and 5G service coexistence specification in 3GPP can be satisfied.

It should be noted that, aside from the above-described power control example indicated in Table 1, in order to satisfy the reference value (a threshold value) of third-order intermodulation distortion $IMD_{3L}$, the transmission power of the first transmission signal may be reduced while maintaining the transmission power of the second transmission signal, or the transmission power of both the first transmission signal and the second transmission signal may be reduced.

The controller of radio-frequency circuit 1A, for example, includes in advance a data table indicating the relationship between the first transmission signal, the second transmission signal, and the intermodulation distortion, such as in Table 1, or a function indicating the relationship between the first transmission signal, the second transmission signal, and the intermodulation distortion.

The controller, for example, obtains a power value corresponding to the output power of power amplifier 11 by measuring power using a coupler disposed in a path from output terminal 110 of power amplifier 11 to antenna element 21. Furthermore, the controller, for example, obtains a power value corresponding to the output power of power amplifier 12 by measuring power using a coupler disposed in a path from output terminal 120 of power amplifier 12 to antenna element 22. In this manner, in the case of obtaining measurement for the output power of power amplifier 11 and power amplifier 12, the controller compares the measured power values of power amplifier 11 and power amplifier 12 and the data table held in advance, and determines whether the power component of the third-order intermodulation distortion that is superimposed on the first transmission signal exceeds the reference value (a threshold value). As a result, when the controller determines that the power component of the third-order intermodulation distortion exceeds the reference value (a threshold value), the controller reduces the transmission power of at least one of power amplifier 11 or power amplifier 12.

It should be noted that the method by which the controller obtains a power value corresponding to the output power of a power amplifier may be measuring using a power measuring device other than a coupler. Furthermore, the controller may obtain, as a value indicating the output power of a power amplifier, the value of requested power sent from a base station, which is the output power required by the transmission signal to be transmitted from communication device 6A. According to this configuration, the controller may predict the output power of power amplifier 11 and power amplifier 12 based on the value of requested power sent from the base station, and determine whether the power component of the third-order intermodulation distortion that is superimposed on the first transmission signal exceeds the reference value (a threshold value) by comparing the predicted values and the data table. As a result, when the controller predicts that the power component of the third-order intermodulation distortion will exceed the reference value (a threshold value), the controller may reduce the transmission power of at least one of power amplifier 11 or power amplifier 12.

Figure 4:
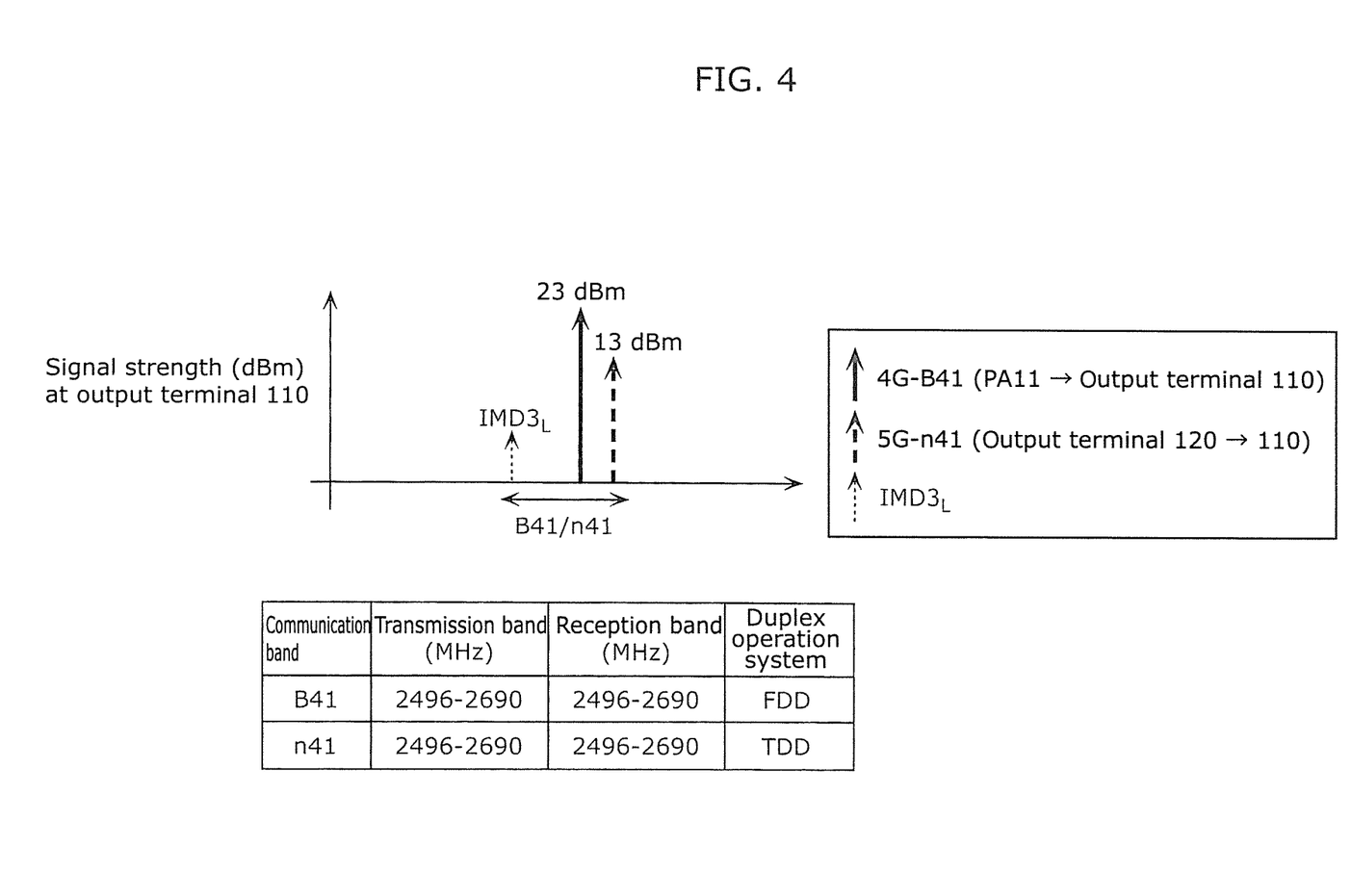
FIG. 4 is an outline diagram representing a second example of a frequency relationship between a 4G-LTE radio-frequency signal, a 5G-NR radio-frequency signal, and intermodulation distortion.

FIG. 4 is an outline diagram representing a second example of a frequency relationship between a 4G-LTE radio-frequency signal, a 5G-NR radio-frequency signal, and intermodulation distortion. The figure indicates the generation of third-order intermodulation distortion in the case where, in radio-frequency circuit 1A, the first transmission amplifying circuit transfers a 4G-LTE Band 41 radio-frequency signal and the second transmission amplifying circuit transfers a 5G-NR n41 radio-frequency signal (EN-DC).

It should be noted that, in this case, the radio-frequency signal transferred in the first transmission amplifying circuit is a signal of a predetermined channel (hereinafter referred to as the first channel) in the 4G-LTE Band 41, and the radio-frequency signal transferred in the second transmission amplifying circuit is a signal of a predetermined channel (hereinafter referred to as the second channel) in the 5G-NR n41. The first channel in the 4G-LTE Band 41 and the second channel in the 5G-NR n41 have different central frequencies.

It should be noted the strengths of the first transmission signal used in 4G that is output from power amplifier 11 and the second transmission signal used in 5G that is output from power amplifier 12 are the same as the first frequency relationship illustrated in FIG. 3.

Here, for example, when the first channel (a first frequency f1) in 4G-LTE Band 41 is a channel on the high-frequency side of Band 41 and the second channel (a second frequency f2) in 5G-NR n41 is a channel on the high-frequency side of n41, third-order intermodulation distortions $IMD_{3L}$ (a frequency: 2f1−f2) and $IMD_{3H}$ (a frequency: 2f2−f1) are generated. Of these, third-order intermodulation distortion $IMD_{3L}$ overlaps with the 4G-LTE Band 41 and 5G-NR n41 bands themselves. At this time, when third-order intermodal distortion $IMD_{3L}$ exceeds the reference value in 3GPP, the in-band spurious emission specification in 3GPP cannot be satisfied, and thus signal quality in the first transmission amplifying circuit and the second transmission amplifying circuit deteriorates.

In contrast, in radio-frequency circuit 1A according to this implemental example, in the period in which the first transmission signal and the second transmission signal are simultaneously output, the transmission power of at least one of power amplifier 11 or 12 is reduced so that the power component of the third-order intermodulation distortion that is superimposed on the first transmission signal or the third-order intermodulation distortion that is superimposed on the second transmission signal becomes less than or equal to the reference value (a threshold value). According to this configuration, the intermodulation distortion generated by the first transmission signal used in 4G and the second transmission signal used in 5G can be reduced. Therefore, the in-band spurious emission specification in 3GPP can be satisfied.

It should be noted that, although the case where the first transmission signal used in 4G and the second transmission signal used in 5G are transmitted simultaneously in radio-frequency circuit 1A according to this implemental example is exemplified, radio-frequency circuit 1 according to this embodiment in FIG. 1 can also be applied to the case of simultaneously transmitting radio-frequency signals of two different communication bands which are for communication systems of the same generation (what is called carrier aggregation).

Furthermore, although in radio-frequency circuit 1A, power amplifiers 11 and 12 and filter circuits 13A and 14A are mounted on a single mounting board, in radio-frequency circuit 1 according to the present disclosure, power amplifiers 11 and 12 and filter circuits 13A and 14A may be mounted on different mounting boards.

Next, the power control of radio-frequency circuit 1A performed by communication device 6A will be described.

Figure 5A:
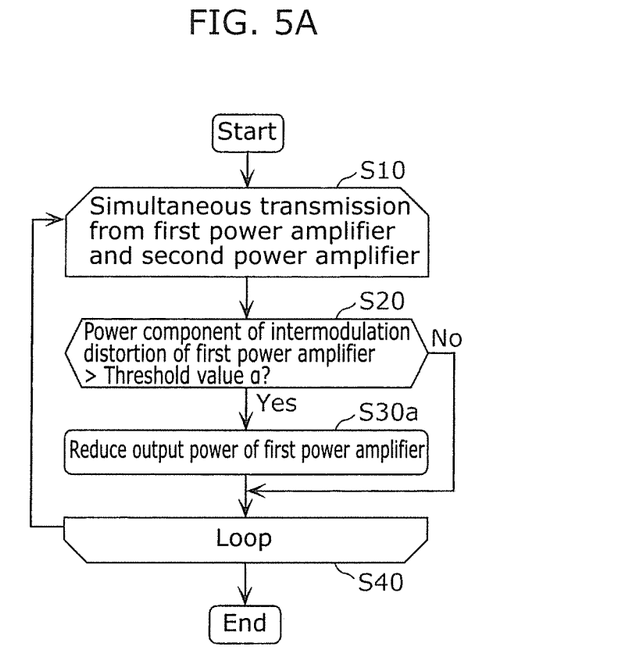
FIG. 5A is a first example of a flowchart for controlling output power of power amplifiers according to the embodiment.

FIG. 5A is a first example of a flowchart for controlling output power of power amplifiers 11 and 12 according to the embodiment in FIG. 1.

First, simultaneous transmission (for example, EN-DC) of the first transmission signal (for example, 4G-LTE Band 41) from power amplifier 11 and the second transmission signal (for example, 5G-NR n41) from power amplifier 12 is started (S10).

Next, the controller of communication device 6A determines whether the power component of the intermodulation distortion that is superimposed on the first transmission signal of power amplifier 11 is greater than a threshold value (a reference value) a (alpha) (S20). In step S20, when the controller determines that the power component of the intermodulation distortion that is superimposed on the first transmission signal is greater than the threshold value (the reference value) a (Yes in step S20), the controller reduces the power of the first transmission signal of power amplifier 11 (S30a). On the other hand, in step S20, when the controller determines that the power component of the intermodulation distortion that is superimposed on the first transmission signal is less than or equal to the threshold value (the reference value) a (No in step S20), the simultaneous transmission of the first transmission signal and the second transmission signal is continued without the controller reducing the power of the first transmission signal of power amplifier 11 and the power of the second transmission signal of power amplifier 12 (S40).

For the period in which the first transmission signal and the second transmission signal are simultaneously transmitted, the controller continues to determine whether the power component of the intermodulation distortion is greater than the threshold value (the reference value) a by returning to step S10 from step S40).

According to this method, in the period in which the first transmission signal and the second transmission signal are simultaneously output, reducing the transmission power of power amplifier 11 which is the target of intermodulation distortion reduction makes it possible for the power level of the intermodulation distortion that is superimposed on the first transmission signal to be reduced to the threshold value (the reference value) α or less.

It should be noted that the threshold value (the reference value) α is, for example, obtained in advance and stored in a memory inside communication device 6A as a data table such as that in Table 1. Furthermore, the threshold value (the reference value) α is not limited to a fixed value and may be a value that is specified each time from the base station.

Figure 5B:
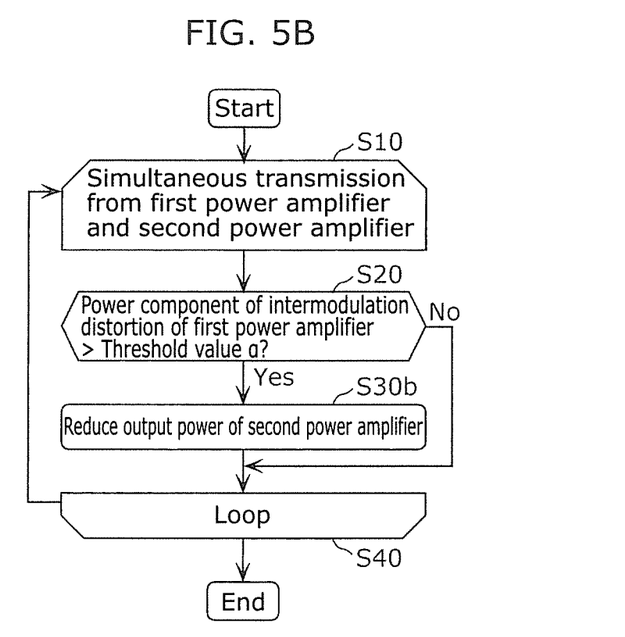
FIG. 5B is a second example of a flowchart for controlling output power of the power amplifiers according to the embodiment.

FIG. 5B is a second example of a flowchart for controlling output power of power amplifiers 11 and 12 according to this embodiment in FIG. 1.

First, simultaneous transmission (for example, EN-DC) of the first transmission signal (for example, 4G-LTE Band 41) from power amplifier 11 and the second transmission signal (for example, 5G-NR n41) from power amplifier 12 is started (S10).

Next, the controller of communication device 6A determines whether the power component of the intermodulation distortion that is superimposed on the first transmission signal of power amplifier 11 is greater than the threshold value (the reference value) α (alpha) (S20). In step S20, when the controller determines that the power component of the intermodulation distortion that is superimposed on the first transmission signal is greater than the threshold value (the reference value) α (Yes in step S20), the controller reduces the power of the second transmission signal of power amplifier 12 (S30b). On the other hand, in step S20, when the controller determines that the power component of the intermodulation distortion that is superimposed on the first transmission signal is less than or equal to the threshold value (the reference value) α (No in step S20), the simultaneous transmission of the first transmission signal and the second transmission signal is continued without the controller reducing the power of the first transmission signal of power amplifier 11 and the power of the second transmission signal of power amplifier 12 (S40).

For the period in which the first transmission signal and the second transmission signal are simultaneously transmitted, the controller continues to determine whether the power component of the intermodulation distortion is greater than the threshold value (the reference value) α by returning to step S10 from step S40).

According to this configuration, in the period in which the first transmission signal and the second transmission signal are simultaneously output, reducing the transmission power of power amplifier 12 which is not the target of intermodulation distortion reduction makes it possible for the power level of the intermodulation distortion that is superimposed on the first transmission signal to be reduced to the threshold value (the reference value) α or less.

It should be noted that the threshold value (the reference value) α is, for example, obtained in advance and stored in a memory inside communication device 6A as a data table such as that in Table 1. Furthermore, the threshold value (the reference value) α is not limited to a fixed value and may be a value that is specified each time from the base station.

Figure 5C:
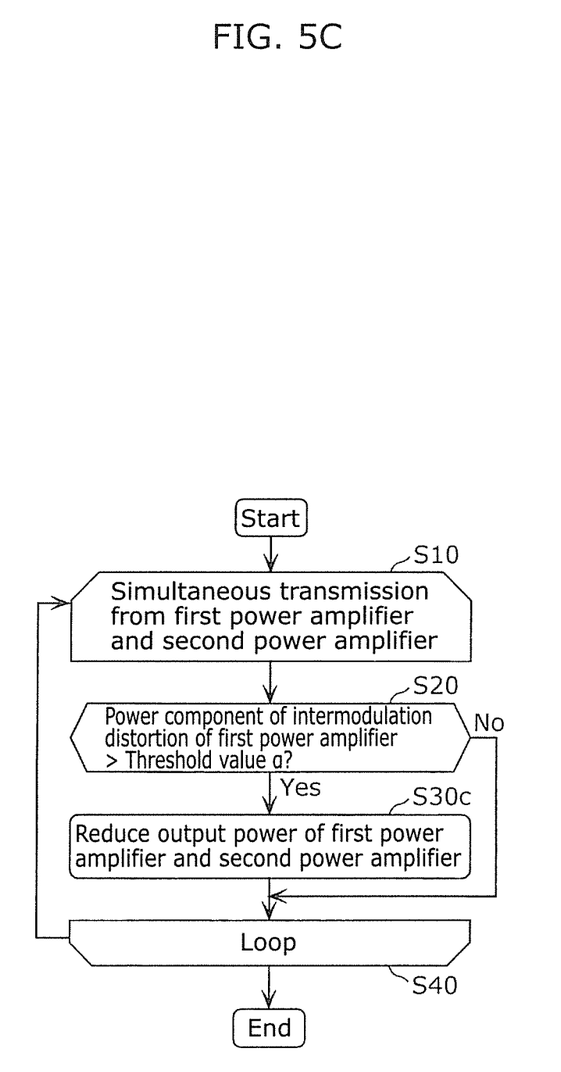
FIG. 5C is a third example of a flowchart for controlling output power of the power amplifiers according to the embodiment.

FIG. 5C is a third example of a flowchart for controlling output power of power amplifiers 11 and 12 according to the embodiment in FIG. 1.

First, the simultaneous transmission (for example, EN-DC) of the first transmission signal (for example, 4G-LTE Band 41) from power amplifier 11 and the second transmission signal (for example, 5G-NR n41) from power amplifier 12 is started (S10).

Next, the controller of communication device 6A determines whether the power component of the intermodulation distortion that is superimposed on the first transmission signal of power amplifier 11 is greater than the threshold value (the reference value) α (alpha) (S20). In step S20, when the controller determines that the power component of the intermodulation distortion that is superimposed on the first transmission signal is greater than the threshold value (the reference value) α (Yes in step S20), the controller reduces both the power of the first transmission signal of power amplifier 11 and the power of the second transmission signal of power amplifier 12 (S30c). On the other hand, in step S20, when the controller determines that the power component of the intermodulation distortion that is superimposed on the first transmission signal is less than or equal to the threshold value (the reference value) α (No in step S20), the simultaneous transmission of the first transmission signal and the second transmission signal is continued without the controller reducing the power of the first transmission signal of power amplifier 11 and the power of the second transmission signal of power amplifier 12 (S40).

For the period in which the first transmission signal and the second transmission signal are simultaneously transmitted, the controller continues to determine whether the power component of the intermodulation distortion is greater than the threshold value (the reference value) α by returning to step S10 from step S40).

According to this method, in the period in which the first transmission signal and the second transmission signal are simultaneously output, reducing the transmission power of both power amplifiers 11 and 12 makes it possible for the power level of the intermodulation distortion that is superimposed on the first transmission signal to be reduced to the threshold value (the reference value) α or less. Furthermore, in this case, the difference between the transmission power of power amplifier 11 and the transmission power of power amplifier 12 can be reduced without considerably reducing the transmission power of only power amplifier 11 or 12. Therefore, the risk of either the first transmission signal or the second transmission signal becoming incommunicable can be reduced.

Furthermore, the threshold value (the reference value) α is, for example, a value disclosed in a table in the coexistence specification and the in-band spurious emission specification in 3GPP, and is obtained in advance and stored in a memory inside communication device 6A as a data table such as that in Table 1. Furthermore, the threshold value (the reference value) α is not limited to a fixed value and may be a value that is specified each time from the base station.

Other Embodiments

Although the radio-frequency circuit and the communication device according to the present disclosure has been described above based on an exemplary embodiment and an implemental example thereof, the radio-frequency circuit and the communication device according to the present disclosure are not limited to the foregoing embodiments and implemental examples thereof. The present invention also encompasses other embodiments achieved by combining arbitrary elements in the above embodiment and implemental example thereof, variations resulting from various modifications to the embodiment and implemental example thereof that may be conceived by those skilled in the art without departing from the essence of the present disclosure, and various devices that include the radio-frequency circuit and the communication device according to the present disclosure.

It should be noted that the radio-frequency circuit and the communication device according to the foregoing embodiments are applied to a communication system such as 3GPP as described above, and are typically applied to a system that simultaneously transmits a 4G-LTE radio-frequency signal and a 5G-NR radio-frequency signal as illustrated in the implemental example. For example, the following can be given as examples of a first communication band/second communication band combination: (1) 4G-LTE Band 41/5G-NR n41, (2) 4G-LTE Band 71/5G-NR n71, (3) 4G-LTE Band 3/5G-NR n3, etc.

Furthermore, radio-frequency circuit and the communication device according to the foregoing embodiment can be applied to a system that simultaneously transmits a 4G-LTE first communication band and a 5G-NR second communication band of different frequency bands or a system that simultaneously transmits a 4G-LTE first communication band and a 4G-LTE second communication band of different frequency bands. In addition, the following can be given as examples of a first communication band/second communication band combination having different frequency bands: (example 3) 5G-NR licensed band/5G-NR unlicensed band, (example 4) 4G-LTE licensed band/4G-LTE unlicensed band, (example 5) 4G-LTE unlicensed band/wireless local area network (WLAN) (5.15 GHz to 7.125 GHz band), (example 6) 5G-NR unlicensed band/WLAN (5.15 GHz to 7.125 GHz band), (example 7) 5G-NR millimeter wave band/4G-LTE, and (example 8) 5G-NR millimeter wave band/WLAN millimeter wave band.

It should be noted that NR-U in Table 2 is a 5G-NR band of at least 5 GHz in 3GPP, and corresponds to the U-NII communication band within the unlicensed band of the Federal Communication Commission (FCC). Furthermore, the WLAN (5.15 GHz to 7.125 GHz band) and the WLAN millimeter band conforms to IEEE 802.11 which is a wireless LAN standard.

In other words, for the first communication band and the second communication band, 4G and 5G licensed bands and unlicensed bands may be applied, or WLAN may be applied. Furthermore, 5G-NR may include the millimeter wave band.

Table 2 shows examples of correspondence between 4G-LTE and 5G-NR communication bands which can be applied as a first communication band for radio-frequency signals transferred in the first transmission amplifying circuit and a second communication band for radio-frequency signals transferred in the second transmission amplifying circuit shown in the foregoing embodiment, and specific examples of intermodulation distortion therebetween.

TABLE 2

| | First communication band | Second communication band | Tx1 (MHz) | Tx2 (MHz) | Rx1 (MHz) | Rx2 (MHz) | IMD 2Tx1-Tx2 2Tx2-Tx1 (MHz) | IMD Tx1-Tx2 Tx2-Tx1 (MHz) | Band over-lapped by IMD |
|---|---|---|---|---|---|---|---|---|---|
| Ex. 1 | n1 | B3 | 1950 | 1760 | 2140 | 1855 | 2140 | 190 | B1(n1)-Rx |
| Ex. 2 | B2 | n66 | 1860 | 1780 | 1940 | 2180 | 1940 | 80 | B2(n2)-Rx |
| Ex. 3 | n79 | B46 NR-U WLAN | 4700 | 5150 | | | 5600 | | B46 NR-U WLAN |
| Ex. 4 | B41 | B46 NR-U WLAN | 2500 | 5150 | | | | 2650 | B41 |
| Ex. 5 | B46 | WLAN | 5150 | 5200 | | | 5250 | | B46 NR-U WLAN |
| Ex. 6 | NR-U | WLAN | 5150 | 5200 | | | 5250 | | B46 NR-U WLAN |
| Ex. 7 | n257 | B1 | 29500 | 1920 | | | | 27580 | n257 |
| Ex. 8 | n257 | WLAN | 29500 | 57000 | | | | 27500 | n257 |

Furthermore, as frequencies of intermodulation distortion caused by two transmission signals (Tx1 and Tx2), $2f_{Tx1}-f_{Tx2}$, $2f_{Tx2}-f_{Tx1}$, $f_{Tx1}-f_{Tx2}$, and $f_{Tx2}-f_{Tx1}$ are typically given as shown in Table 2, but aside from these, frequencies stipulated by $mf_{Tx1} \pm mf_{Tx2}$, and $mf_{Tx2} \pm mf_{Tx1}$ (m and n are natural numbers) are also included.

Furthermore, although in radio-frequency circuit 1A according to the implemental example, power amplifiers 11 and 12 are mounted in a single mounting board, in the radio-frequency circuit according to the present disclosure, power amplifiers 11 and 12 may be mounted in mutually different mounting boards. Furthermore, in the radio-frequency circuit according to the present disclosure, power amplifiers 11 and 12 may be included in mutually different modules. Moreover, in the radio-frequency circuit according to the present disclosure, power amplifiers 11 and 12 may be included in mutually different mobile system base terminals.

Furthermore, although in the foregoing embodiments and implemental examples thereof, a configuration for the case of simultaneously using two different communication bands was given as an example, the radio-frequency circuit and the communication device according to the present disclosure can also be applied to a configuration for the case of simultaneously using three or more different communication bands. In other words, a radio-frequency circuit or communication device that simultaneously uses three or more different communication bands and includes the elements of the radio-frequency circuit and communication device according to the foregoing embodiment and the implemental examples thereof.

Furthermore, the present disclosure also encompasses an antenna module including radio-frequency circuit 1 or 1A which includes output terminal 110 through which a first transmission signal is output and output terminal 120 through which a second transmission signal having a different frequency from the first transmission signal is output, antenna element 21 (a first antenna element) connected to output terminal 110, and antenna element 22 (a second antenna element) connected to output terminal 120. The antenna module is realized by mounting radio-frequency circuit 1 or 1A, and antenna elements 21 and 22 on a single module substrate. Furthermore, the antenna module may be realized by mounting radio-frequency circuit 1 or 1A, and antenna elements 21 and 22 in a single package.

According to this configuration, it is possible to provide a small-sized antenna module that reduces generation of unwanted waves such as intermodulation distortion when the first transmission signal and the second transmission signal are being simultaneously transmitted. Furthermore, when the first transmission signal and the second transmission signal are signals in the millimeter wave band, the antenna module can be further miniaturized.

Furthermore, for example, in the radio-frequency circuit and communication device according to the foregoing embodiment and the implemental example thereof, another radio-frequency circuit element and wiring may be inserted in a path connecting circuit elements, a path connecting a circuit element and a signal path, and a path connecting signal paths which are disclosed in the drawings.

Furthermore, the controller according to the present disclosure may be realized as an integrated circuit (IC) or large scale integration (LSI). Furthermore, the method of implementation of structural elements using an integrated circuit may be realized using a dedicated circuit or a general-purpose processor. A field programmable gate array (FPGA) that allows for programming after the manufacture of an LSI, or a reconfigurable processor that allows for reconfiguration of the connection and the setting of circuit cells inside an LSI may be employed. When circuit integration technology that replaces LSIs comes along owing to advances of the semiconductor technology or to a separate derivative technology, the function blocks may understandably be integrated using that technology.

The present disclosure can be widely used in communication apparatuses such as a mobile phone, as a multiband/multimode-compatible front-end module employing carrier aggregation or EN-DC.

What is claimed is:

1. A radio-frequency circuit, comprising:
   a first power amplifier configured to output a first transmission signal, the first transmission signal corresponding to a first communication band of a fourth generation (4G) mobile communication system;
   a second power amplifier configured to output a second transmission signal having a frequency different from a frequency of the first transmission signal, the second transmission signal corresponding to a second communication band of a fifth generation (5G) mobile communication system;
   a first filter circuit connected to an output terminal of the first power amplifier, the first filter circuit comprising a first plurality of filters and a first plurality of switches, the first plurality of switches comprising a first switch and a second switch, the first filter circuit further comprising a multiplexer connected to at least one of the first plurality of switches, wherein:
   in a period in which outputting the first transmission signal from the first power amplifier and outputting the second transmission signal from the second power amplifier are simultaneously executed, and in which a frequency of intermodulation distortion generated from the first and second transmission signals overlaps with a transmission frequency of the first communication band or a transmission frequency of the second communication band, at least one of the first power amplifier or the second power amplifier is configured to reduce transmission power of the at least one of the first power amplifier or the second power amplifier to cause a power component of the intermodulation distortion to be less than or equal to a threshold value that satisfies a 4G and 5G coexistence specification of the third generation partnership project (3GPP), the intermodulation distortion being superimposed on one of the first transmission signal output from the first power amplifier and the second transmission signal output from the second power amplifier, and the frequency of the intermodulation distortion is included in a passband of at least one of the first plurality of filters.

2. The radio-frequency circuit according to claim 1, further comprising:
a first output terminal through which the first transmission signal is output; and
a second output terminal through which the second transmission signal is output, wherein
the first output terminal and the second output terminal are connected to mutually different antenna elements.

3. The radio-frequency circuit according to claim 2, wherein the first filter circuit is connected between the output terminal of the first power amplifier and the first output terminal.

4. The radio-frequency circuit according to claim 1, wherein
at least one of the first or second communication bands includes a licensed or unlicensed band.

5. The radio-frequency circuit according to claim 1, wherein:
the first communication band is a 4G-LTE communication band and the second communication band is a 5G-NR communication band.

6. The radio-frequency circuit according to claim 1, wherein in the period in which the outputting of the first transmission signal and the outputting of the second transmission signal are simultaneously executed, the first power amplifier is configured to reduce power of the first transmission signal to cause the power component of the intermodulation distortion superimposed on the first transmission signal to be less than or equal to the threshold value.

7. The radio-frequency circuit according to claim 1, wherein in the period in which the outputting of the first transmission signal and the outputting of the second transmission signal are simultaneously executed, the second power amplifier is configured to reduce power of the second transmission signal to cause the power component of the intermodulation distortion superimposed on the first transmission signal to be less than or equal to the threshold value.

8. The radio-frequency circuit according to claim 1, wherein in the period in which the outputting of the first transmission signal and the outputting of the second transmission signal are simultaneously executed, the first power amplifier and the second power amplifier are configured to reduce power of the first transmission signal and power of the second transmission signal, respectively, to cause the power component of the intermodulation distortion superimposed on one of the first transmission signal and the second transmission signal to be less than or equal to the threshold value.

9. The radio-frequency circuit according to claim 1, further comprising:
a second filter circuit connected to an output terminal of the second power amplifier, the second filter circuit comprising a second plurality of switches.

10. The radio-frequency circuit according to claim 9, wherein the second plurality of switches comprising a third switch and a fourth switch.

11. The radio-frequency circuit according to claim 10, wherein the second filter circuit further comprises a second plurality of filters that are connected between the third switch and the fourth switch.

12. The radio-frequency circuit according to claim 11, wherein the second filter circuit further comprises a second multiplexer, wherein the fourth switch is disposed between the second multiplexer and at least one filter of the second plurality of filters.

13. The radio-frequency circuit according to claim 11, wherein the second plurality of filters comprises at least two filters disposed between the third switch and the fourth switch.

14. The radio-frequency circuit according to claim 1, wherein the second switch is disposed between the first multiplexer and at least one filter of the first plurality of filters.

15. The radio-frequency circuit according to claim 14, wherein the second switch is configured to switch a connection between at least one filter of the first plurality of filters and the first multiplexer.

16. The radio-frequency circuit according to claim 1, wherein the first plurality of filters comprises at least two filters disposed between the first switch and the second switch.

17. The radio-frequency circuit according to claim 1, wherein the first multiplexer comprises a low-pass filter, a bandpass filter, and a high-pass filter.

18. A communication device, comprising:
a signal processing circuit configured to process a radio-frequency signal; and
the radio-frequency circuit according to claim 1 configured to receive the radio-frequency signal processed by the signal processing circuit.

19. The communication device according to claim 18, wherein the signal processing circuit includes a controller configured to perform control for reducing the transmission power of the at least one of the first power amplifier or the second power amplifier to cause the power component of the intermodulation distortion to be less than or equal to the threshold value, the intermodulation distortion being generated by the first transmission signal output from the first power amplifier and the second transmission signal output from the second power amplifier.

20. An antenna module, comprising:
the radio-frequency circuit according to claim 2 including the first output terminal through which the first transmission signal is output and the second output terminal through which the second transmission signal is output;
a first antenna element connected to the first output terminal; and
a second antenna element connected to the second output terminal.

* * * * *

UNITED STATES PATENT AND TRADEMARK OFFICE
CERTIFICATE OF CORRECTION

| | | |
|---|---|---|
| PATENT NO. | : 11,509,336 B2 | Page 1 of 1 |
| APPLICATION NO. | : 16/897465 | |
| DATED | : November 22, 2022 | |
| INVENTOR(S) | : Shinya Hitomi et al. | |

It is certified that error appears in the above-identified patent and that said Letters Patent is hereby corrected as shown below:

In the Specification

Column 8, Line 22, "control signal from RFIC" should be -- control signal from RFIC 3. --.

Signed and Sealed this
Thirty-first Day of October, 2023

Katherine Kelly Vidal
*Director of the United States Patent and Trademark Office*